United States Patent
Pavesi et al.

(10) Patent No.: US 6,964,574 B2
(45) Date of Patent: Nov. 15, 2005

(54) DAUGHTER BOARD FOR A PROTOTYPING SYSTEM

(75) Inventors: Marco Pavesi, Vigevano (IT); Riccardo Gemelli, San Colombano (IT); Fabio De Pieri, Pogliano Milanese (IT); Maurizo Grassi, Pregnana Milanese (IT); Mauro Ferloni, Milan (IT)

(73) Assignee: Italtel S.p.A., Milan (IT)

( * ) Notice: Subject to any disclaimer, the term of this patent is extended or adjusted under 35 U.S.C. 154(b) by 0 days.

(21) Appl. No.: 10/432,647
(22) PCT Filed: Nov. 15, 2001
(86) PCT No.: PCT/IT01/00574

§ 371 (c)(1),
(2), (4) Date: Nov. 21, 2003

(87) PCT Pub. No.: WO02/43299

PCT Pub. Date: May 30, 2002

(65) Prior Publication Data

US 2004/0066615 A1 Apr. 8, 2004

(30) Foreign Application Priority Data

Nov. 24, 2000 (EP) .................................. PCT/EP00/11821

(51) Int. Cl.[7] .............................................. H01R 12/00
(52) U.S. Cl. ............................. 439/76; 439/74; 361/683
(58) Field of Search .............................. 439/76, 59–62, 439/65, 74–75; 361/683

(56) References Cited

U.S. PATENT DOCUMENTS

| | | | |
|---|---|---|---|
| 4,133,592 A | * 1/1979 | Cobaugh et al. | 439/74 |
| 4,733,461 A | * 3/1988 | Nakano | 29/830 |
| 5,462,442 A | * 10/1995 | Umemura et al. | 439/69 |
| 5,536,177 A | * 7/1996 | Casey | 439/74 |
| 5,575,686 A | * 11/1996 | Noschese | 439/620 |
| 5,982,635 A | * 11/1999 | Menzies et al. | 361/790 |
| 6,328,572 B1 | * 12/2001 | Higashida et al. | 439/61 |

* cited by examiner

*Primary Examiner*—Michael C. Zarroli
(74) *Attorney, Agent, or Firm*—Stephen Bongini; Fleit, Kain, Gibbons, Gutman, Bongini & Bianco P.L.

(57) ABSTRACT

A daughter board (405) is provided for a prototyping system (100). The daughter board includes a first surface for facing a mother board (115) of the prototyping system, and a second surface opposed thereto. The daughter board further includes a connector (410) for a corresponding socket (210) of the mother board arranged on the first surface. The connector includes multiple elements (410t–410b), each one including an insulating support and multiple leads. The daughter board also includes multiple contacts (482) for corresponding functional terminals of a programmable device (420) arranged on the second surface. Each contact is connected to a corresponding lead (476) of the connector. The elements of the connector are arranged along the edges of a regular polygon.

16 Claims, 9 Drawing Sheets

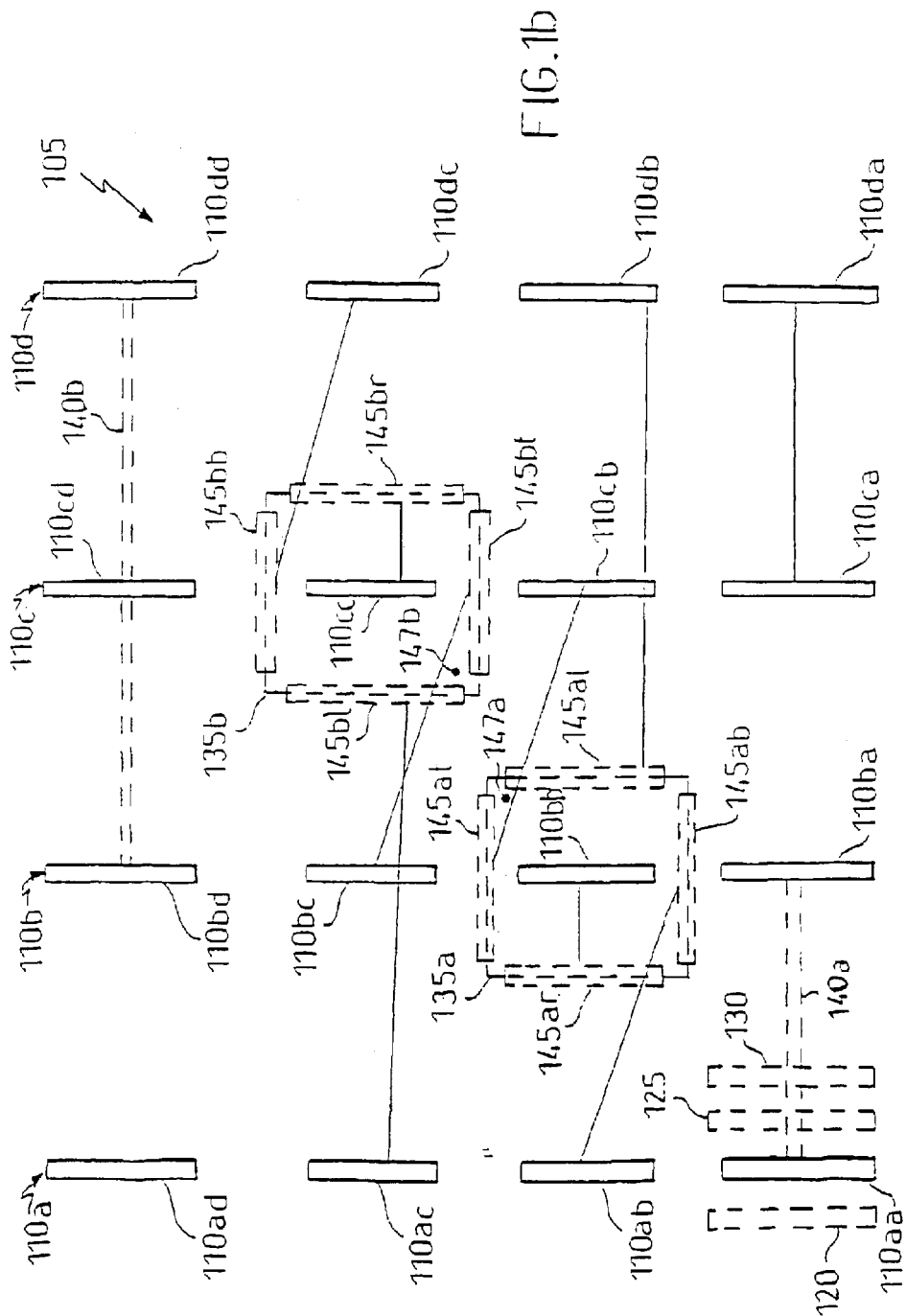

DAUGHTER BOARD FOR A PROTOTYPING SYSTEM

FIELD OF THE INVENTION

The present invention relates to a daughter board for a prototyping system.

BACKGROUND OF THE INVENTION

Prototyping systems are commonly used for validating electronic circuits. A prototyping system makes it possible to create a physical implementation of the electronic circuit under validation (a prototype). The prototype is tested in order to determine whether the electronic circuit exhibits the desired features; for example, this is an essential step of the design process of any complex electronic circuit, such as a digital ASIC (Application Specific Integrated Circuit).

Typically, the prototype is created scattering the electronic circuit across several FPGAs (Field-Programmable Gate Arrays) that are connected together. A known solution is that of employing a breadboard, which consists of a printed circuit board that is custom designed in order to meet the specific routing requirements of the prototype. The FPGAs are placed onto the breadboard and connected together through conductive tracks. This structure allows the prototype to run at a frequency that is close to the one of the actual electronic circuit (real-time prototyping).

However, the making of the breadboard is an expensive process, in terms of both manpower costs and development time; moreover, it is not possible to re-use the breadboard for a different prototype. The solution described above is quite rigid, since the breadboard cannot be altered in any way.

A different solution is that of using a field-programmable printed circuit board, which is provided with a grid of holes for plugging in the FPGAS. These holes are grouped into sections, with all holes in a section leading to corresponding pins of a switch matrix; the switch matrices communicate between themselves with direct hardwired connections. This architecture provides a high routing flexibility, since a complete interconnectivity of the FPGAs can be obtained by suitably configuring the switch matrices.

However, in the solution described above each signal to be transmitted between two FPGAs must go through some switches. This introduces considerable delays, which reduce the operative frequency of the prototype; therefore, the prototype can only run at a speed significantly lower than the one of the actual electronic circuit.

In many cases, a real world target system in which the electronic circuit must operate has timing constraints; particularly, some components of the target system cannot be slowed down too much, for example because an internal PLL does not work below a threshold frequency. As a consequence, it is not possible to connect the prototype to other systems directly; this does not allow the prototype to be operated and tested under normal working conditions.

Similar drawbacks are also suffered using alternative topologies for interconnecting the FPGAs. For example, known prototyping systems envisage a mesh (wherein each FPGA is connected to the nearest-neighbour FPGAs, possibly through one or more hops), a cross-bar (wherein the FPGAs are connected to a routing-only element, possibly with a hierarchical structure), virtual wires or pin multiplexing (wherein signals are multiplexed over a reduced number of physical wires), and the like.

Modular systems have been also proposed. In these systems, the FPGAs are mounted on daughter boards that are connected together or to a mother board in order to attain the desired configuration of the prototyping system.

However, none of the daughter boards known in the art has a structure that is specifically tailored to the use in a very high-speed prototyping system. Therefore, the daughter boards have a detrimental impact on the performance of the whole prototyping system. This introduces additional delays, which further reduce the operative frequency of the prototype.

SUMMARY OF THE INVENTION

It is an object of the present invention to overcome the above-mentioned drawbacks. In order to achieve this object, a daughter board for a prototyping system as set out in the first claim is proposed.

Briefly, the present invention provides a daughter board for a prototyping system having a first surface for facing a mother board of the prototyping system and a second surface opposed thereto and including a connector for a corresponding socket of the mother board arranged on the first surface, the connector consisting of a plurality of elements each one including an insulating support and a plurality of leads, and a plurality of contacts for corresponding functional terminals of a programmable device arranged on the second surface, each contact being connected to a corresponding lead of the connector, wherein the elements of the connector are arranged along the edges of a regular polygon.

Moreover, the present invention also provides a prototyping system including the daughter board.

BRIEF DESCRIPTION OF DRAWINGS

Further features and the advantages of the solution according to the present invention will be made clear by the following description of a preferred embodiment thereof, given purely by way of a non-restrictive indication, with reference to the attached figures, in which:

FIG. 1b depicts a back-plane of the prototyping system in a schematic view;

DETAILED DESCRIPTION OF THE PREFERRED EMBODIMENTS

Figure 1A:
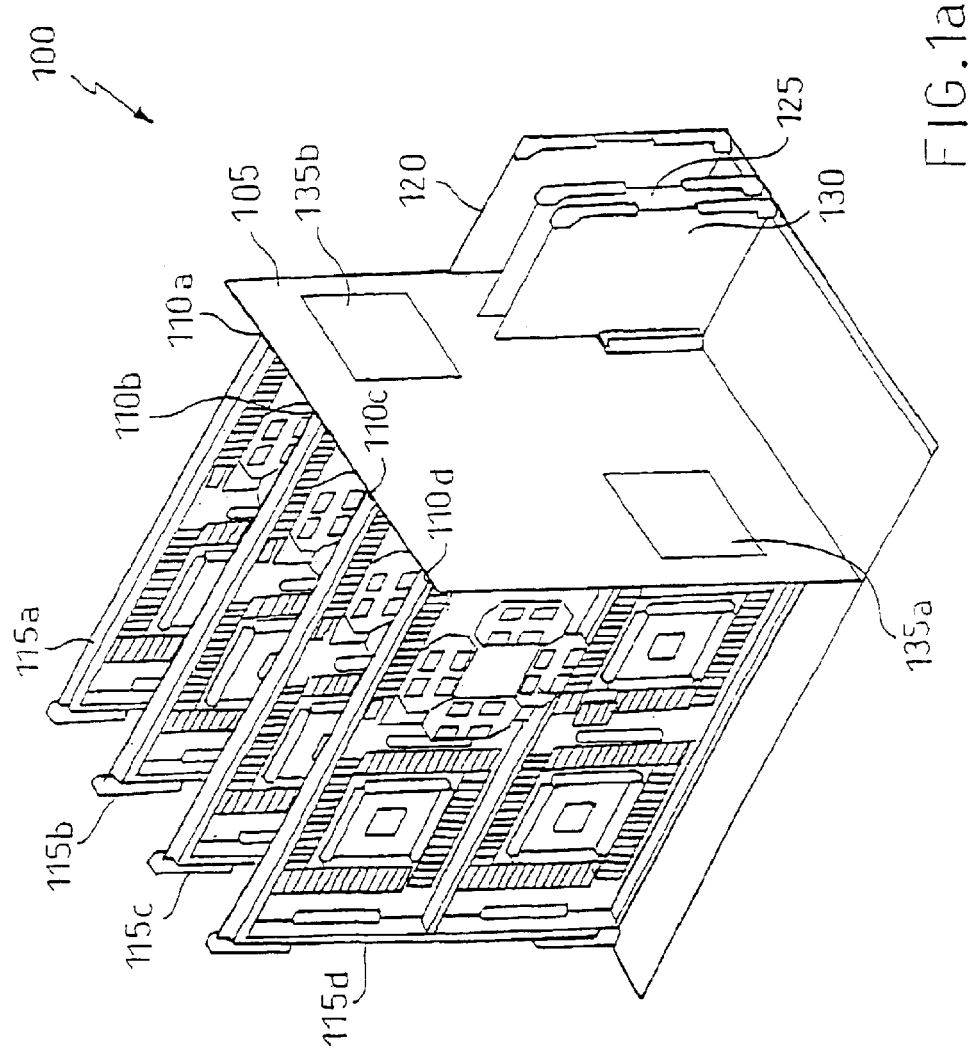
FIG. 1a is a prospective view of a prototyping system in which the daughter board of the invention can be used.

With reference in particular to FIG. 1a, there is shown a system 100 used as a physical platform for the fast prototyping of an electronic circuit. The prototyping system 100 includes a back-plane 105, which consists of a multi-layer printed circuit board including supports for communicating with a host computer (not shown in the figure), both for downloading programming and for uploading data captured during a prototyping process.

The back-plane 105 has a plurality of slots 110a, 110b, 110c and 110d arranged on a front surface thereof (four in the example shown in the figure). A mother board 115a, 115$b$, 115$c$ and 115$d$ is plugged into the respective slot 110$a$, 110$b$, 110$c$ and 110$d$. The back-plane 105 is also provided with several system boards, which are plugged into corresponding slots arranged on a rear surface of the back-plane 105, such as a compact PCI single board computer 120, a compact PCI carrier 125, and a clock board 130. Two daughter bards 135$a$ and 135$b$ (such as cross-bar boards) can be plugged into corresponding sockets on the rear surface of the back-plane 105; the cross-bar boards 135$a$, 135$b$ are arranged along a diagonal of the back-plane 105.

Similar considerations apply if the back-plane has a different number of slots for the mother boards, if the mother boards and the system boards are all arranged on the same surface of the back-plane, if different system boards are used, if the sockets are used for plugging in different components (such as a bridge), and the like.

Considering now the front surface of the back-plane 105 shown in the FIG. 1$b$, each slot 110$i$ (with i=a ... d) consists of four slot elements 110$ia$, 110$ib$, 110$ic$ and 110$id$. The slot elements 110$aa$ and 110$ba$, are connected to a PCI bus 140$a$ (associated with the boards 120, 125 mounted on the rear surface of the back-plane 105); the slot elements 110$ca$ and 110$da$ are connected to each other directly. The slot elements 110$bd$, 110$cd$ and 110$dd$ are likewise connected to a further bus 140$b$ (for example of the ISA type). The clock board 130 generates a plurality of global clock signals, which are distributed to all the slots 110$a$–110$d$ by means of a balanced tree of conductive tracks on the back-plane 105.

Each cross-bar board 135$a$, 135$b$ is plugged into a respective socket, which is square-shaped and has a top element 145$at$, 145$bt$ and a right element 145$ar$, 145$br$ moving counter clockwise from an insertion key 147$a$, 147$b$ (for a reference key of the cross-bar board 135$a$, 135$b$), and a left element 145$al$, 145$bl$ and a bottom element 145$ab$, 145$bb$ moving clockwise from the insertion key 147$a$, 147$b$. The sockets (denoted as a whole with 145$a$ and 145$b$) are turned in order to have the insertion keys facing to each other.

The socket element 145$at$ is connected to the slot element 110$cb$, the socket element 145$al$ is connected to the slot element 110$db$, the socket element 145$ab$ is connected to the slot element 110$ab$, and the socket element 145$ar$ is connected to the slot element 110$bb$. On the other hand, the socket element 145$bt$ is connected to the slot element 110$bc$, the socket element 145$bl$ is connected to the slot element 110$ac$, the socket element 145$bb$ is connected to the slot element 110$dc$, and the socket element 145$br$ is connected to the slot element 110$cc$.

Similar considerations apply if the back-plane has a different structure, if each slot consists of a different number of elements (down to a single one), if a different number of cross-bar boards and buses is envisaged (down to a single cross-bar board and/or a single bus), if the buses are of a different type or have a different length, and so on.

Figure 2:
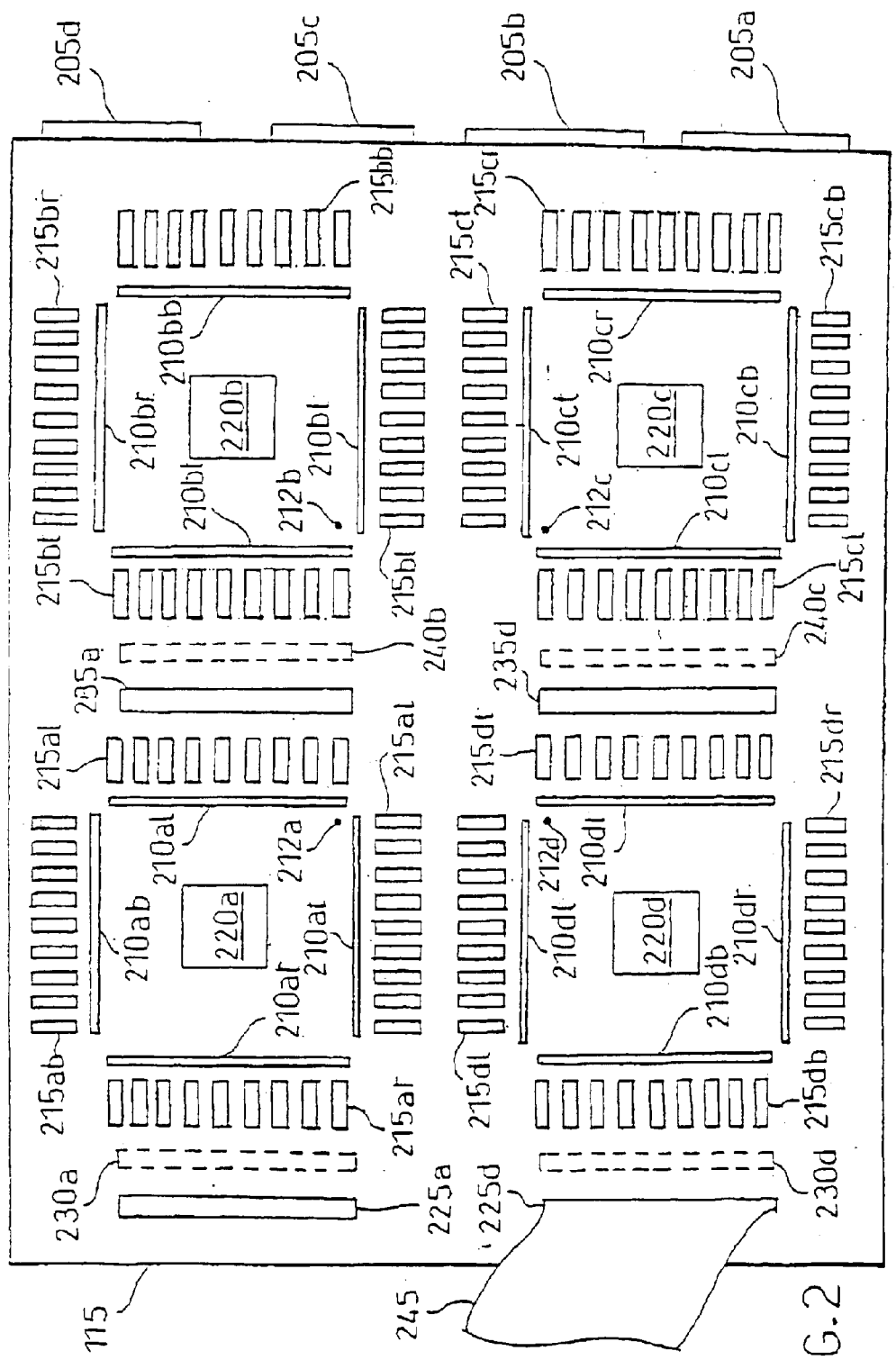
FIG. 2 shows a mother board of the prototyping system.

Considering now FIG. 2, a generic mother board 115 consists of a multi-layer printed circuit board (for example with 16 layers) having an edge connector formed by four elements 205$a$, 205$b$, 205$c$ and 205$d$, which are plugged into the corresponding slot elements of the back-plane. The mother board 115 is provided with four sockets, which are arranged at respective corners of a rectangle on a front surface of the mother board 115. The i-th socket (with i=a ... d) is square-shaped and has a left element 210$il$ and a bottom element 210$ib$ moving counter clockwise from an insertion key 212$i$, and a top element 210$it$ and a right element 210$ir$ moving clockwise from the insertion key 212$i$. The sockets 210$a$–210$d$ are turned in order to have the insertion keys 212$a$–212$d$ inward-looking the rectangle along which the sockets 210$a$–210$d$ are arranged.

A bank of electronic switches is placed around the respective socket (denoted as a whole with 210$a$, 210$b$, 210$c$ and 210$d$). The i-th bank of switches consists of a left set 215$il$, a bottom set 215$ib$, a top set 210$it$ and a right set 210$ir$, which are associated with the respective socket elements 210$il$, 210$ib$, 210$it$ and 210$ir$. The switches (denoted as a whole with 215$a$, 215$b$, 215$c$ and 215$d$) are controlled by one or more banks of flash E²PROMs 220$a$, 220$b$, 220$c$ and 220$d$, respectively, which are mounted onto the mother board 115 inside the corresponding sockets 210$a$, 210$b$, 210$c$ and 210$d$.

Forward sockets 225$a$ and 225$d$ are provided on the front surface of the mother board 115 (to the left of the sockets 210$a$ and 210$d$, respectively); backward sockets 230$a$ and 230$d$ are provided on a rear surface of the mother board 115 (to the right of the forward sockets 225$a$ and 225$d$, respectively), and further forward sockets 235$a$ and 235$d$ are placed on the front surface of the mother board 115 (to the right of the sockets 210$a$ and 210$d$, respectively). Moreover, further backward sockets 240$b$ and 240$c$ are placed on the rear surface of the mother board 115 (to the left of the sockets 210$b$ and 210$c$, respectively).

The forward sockets 225$a$, 225$d$, 235$a$ and 235$d$ are used to connect the mother board 115 to a next adjacent mother board (facing the mother board 115); the backward sockets 230$a$, 230$d$, 240$b$ and 240$c$ are likewise used to connect the mother board 115 to a previous adjacent mother board. In particular, each forward socket is connected to the corresponding backward socket of the next mother board by means of a flat, flexible printed circuit 245 terminating with mating connectors (as shown in the figure for the forward socket 225$d$).

The forward and backward sockets increase the connectivity capability of the prototyping system; the interconnection of the mother boards is facilitated by their arrangement (with each mother board extending perpendicularly from the back-plane and facing the adjacent mother board). Advantageously, the use of the flexible printed circuits (with a transmission time of a few ns) does not introduce any slow down of the system. Moreover, the cross-bar boards and the buses on the back-plane further increase the connectivity capability of the prototyping system.

Alternatively, the mother boards are connected together in a different way, the mother boards are arranged elsewhere (for example extending from both the surfaces of the back-plane), no backward and forward sockets are provided on the mother boards (being connected together only via the back-plane), or the prototyping system consists of a single mother board (without any back-plane).

Figure 3A:
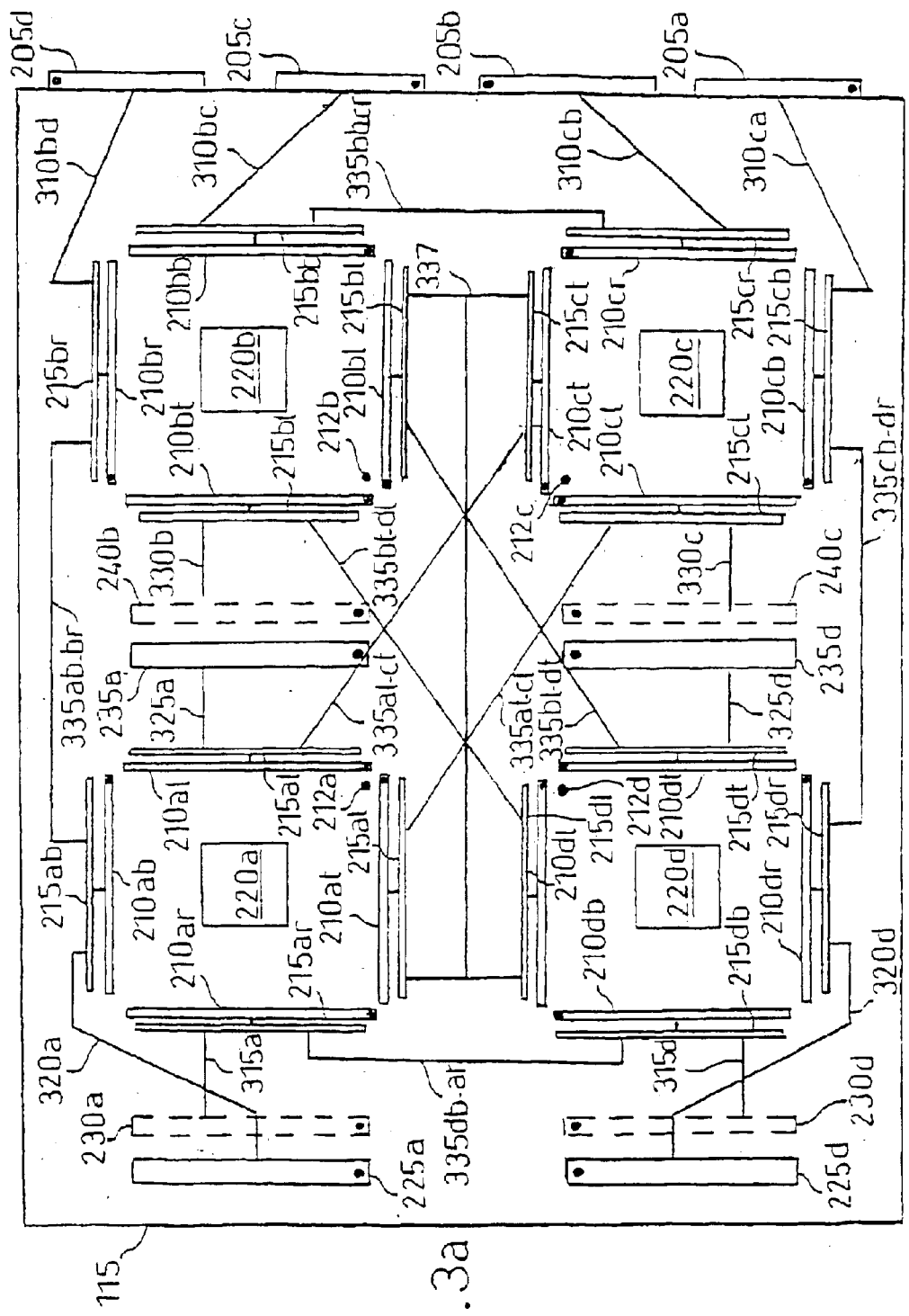
FIGS. 3a and 3b are a schematic block diagram of the mother board and of a particular thereof, respectively.

With reference to FIG. 3$a$, each socket element consists for example of 228 female leads, or holes, and 6 power female elements for providing three distinct power supply voltages; the holes are numbered (from 1 to 228) starting from the insertion key and moving counter clockwise along the left and bottom socket elements and moving clockwise along the top and right socket elements.

Each edge connector 205$a$–$d$ consists of 228 male leads, or pins, and 6 power male elements; the pins of the edge connector elements 205$a$, 205$c$ are numbered from the bottom to the top, whereas the pins of the edge connector elements 205$b$, 205$d$ are numbered from the top to the bottom. The edge connector elements 205$a$, 205$d$ allow the mother board 115 to access the respective buses provided on the back-plane, and the edge connector elements 205$b$, 205$c$ allow the mother board 115 to access the respective crossbar boards plugged into the back-plane.

A connection 310ca extends between the socket element 210cb and the edge connector element 205a, and a connection 310bd extends between the socket element 210br and the edge connector element 205d; a connection 310cb extends between the socket element 210cr and the edge connector element 205b, and a connection 310bc extends between the socket element 210bb and the edge connector element 205c.

Each forward and backward socket consists of 228 pins; the pins of the forward sockets 225a, 235a and of the backward sockets 230a, 230b are numbered from the bottom to the top, whereas the pins of the forward sockets 225d, 235d and of the backward sockets 230d, 230c are numbered from the top to the bottom. The forward and backward sockets are connected to corresponding socket elements. Particularly, a connection 315a extends between the socket element 210ar and the backward socket 230a, and a connection 315d extends between the socket element 210db and the backward socket 230d; a connection 320a extends between the socket element 210ab and the forward socket 225a, a connection 320d extends between the socket element 210dr and the forward socket 225d, a connection 325a extends between the socket element 210al and the forward socket 235a, and a connection 325d extends between the socket element 210dt and the forward socket 235d. Moreover, a connection 330b extends between the socket element 210bt and the backward socket 240b, and a connection 330c extends between the socket element 210cl and the backward socket 240c.

The mother board 115 further includes several point-to-point connections for pairs of the sockets 210a–d. Particularly, a connection 335ab-br extends between the socket elements 210ab and 210br, a connection 335bb-cr extends between the socket elements 210bb and 210cr, a connection 335cb-dr extends between the socket elements 210cb and 210dr, and a connection 335db-ar extends between the socket elements 210db and 210ar. Moreover, a connection 335al-ct extends between the socket elements 210al and 210ct, a connection 335at-cl extends between the socket elements 210at and 210cl, a connection 335bt-dl extends between the socket elements 210bt and 210dl, and a connection 335bl-dt extends between the socket elements 210bl and 210dt. Moreover, the socket elements 210at, 210dl, 210bl and 210ct are coupled to a bus connection 337.

The above-described connections are implemented by means of one or more conductive tracks (each one provided on a corresponding layer of the mother board 115), which are coupled through via-holes.

Similar considerations apply if the mother board has a different number of edge connector elements, if the switches and the memories are placed elsewhere, if the mother board is provided with a different number of forward and backward sockets, if the sockets are coupled in a different manner with the edge connectors, the backward and forward sockets, or the other sockets, and the like.

Figure 3B:
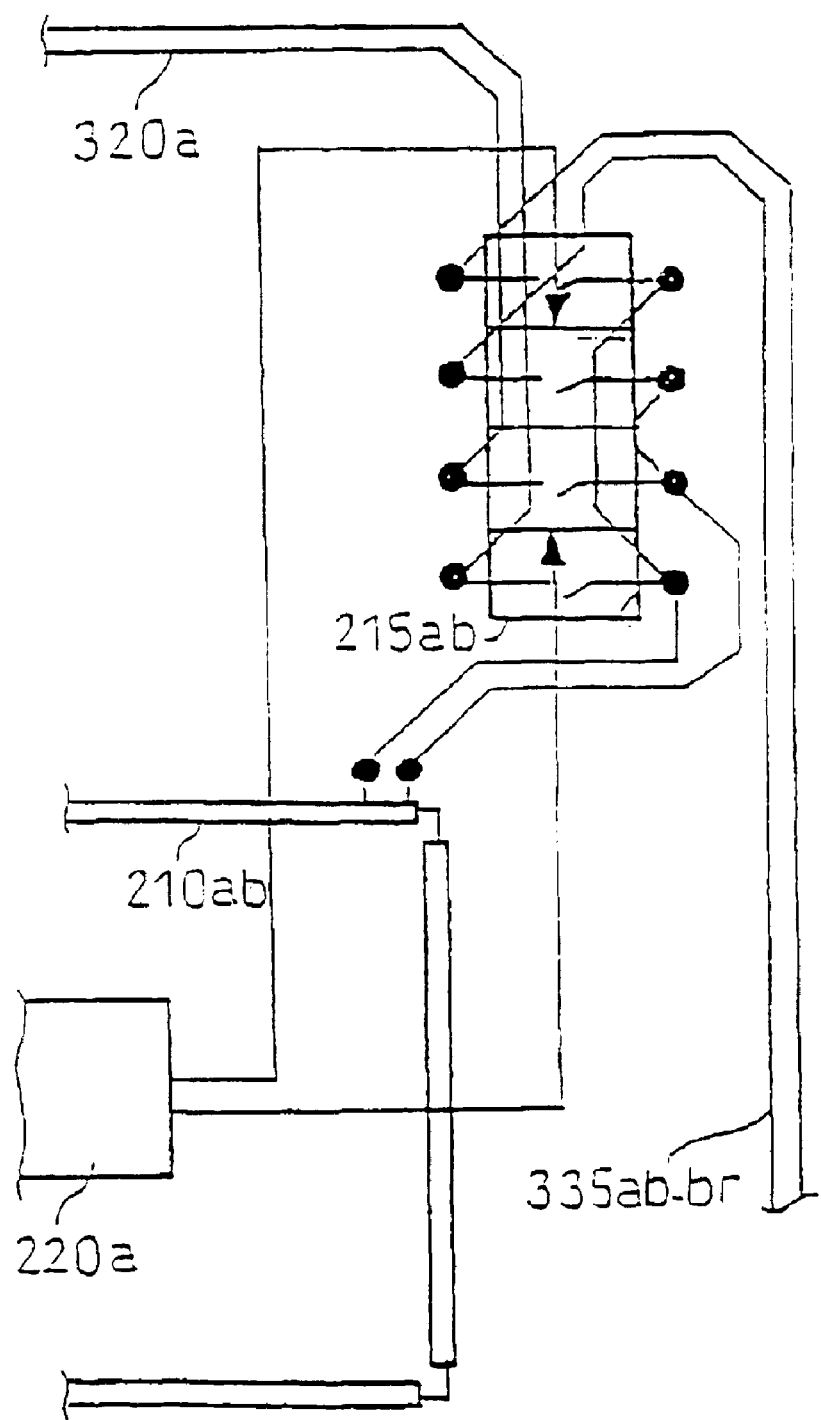

The holes of each socket element are selectively connected to one or more of the corresponding connections by means of the respective switches. For example, as shown in FIG. 3b, each hole of the socket element 210ab is connected (by means of a conductive track) to a terminal of a first and a second of the switches 215ab; the other terminal of the first switch is connected to a line of the connection 320a, and the other terminal of the second switch is connected to a line of the connection 335ab-br.

The two switches associated with each hole of the socket element 210ab (implemented for example by means of pass-transistors) are controlled by respective signals provided by the memory 220a; for example, a bit stored in the memory 220a controls the switch in an open or closed condition when the bit has the value 0 or 1, respectively. In this way, the combinations 01 and 10 alternatively connect the hole of the socket element 210ab to the corresponding line of the connection 320a or of the connection 335ab-br, respectively, whereas the combination 00 insulates the hole of the socket element 210ab from both the connection 320a and the connection 335ab-br (the combination 11, connecting the hole of the socket element 210ab simultaneously to the connection 320a and to the connection 335ab-br, is preferably not used). The provision of two switches results in a good compromise between flexibility and simplicity.

Advantageously, the socket element 210ab is split into several sets of sequential holes (for example 28 sets each one of 8 holes, with the remaining 4 holes reserved for test purpose). All the switches 215ab associated with the holes of each set are controlled by the same pair of bits provided by the memory 220a; in this way, the number of signals required is strongly reduced, however maintaining a good flexibility of the structure.

Similar considerations apply if the switches are implemented by different electronic components, if each hole of the sockets on the mother board is connected to three or more switches, if each bit controls a different number of switches (down to a single one), if the same signal controls the corresponding switches at both ends of each point-to-point connection (with memories of lower capacity, but with a more complex routing of the control signals), and the like.

Figure 4A:
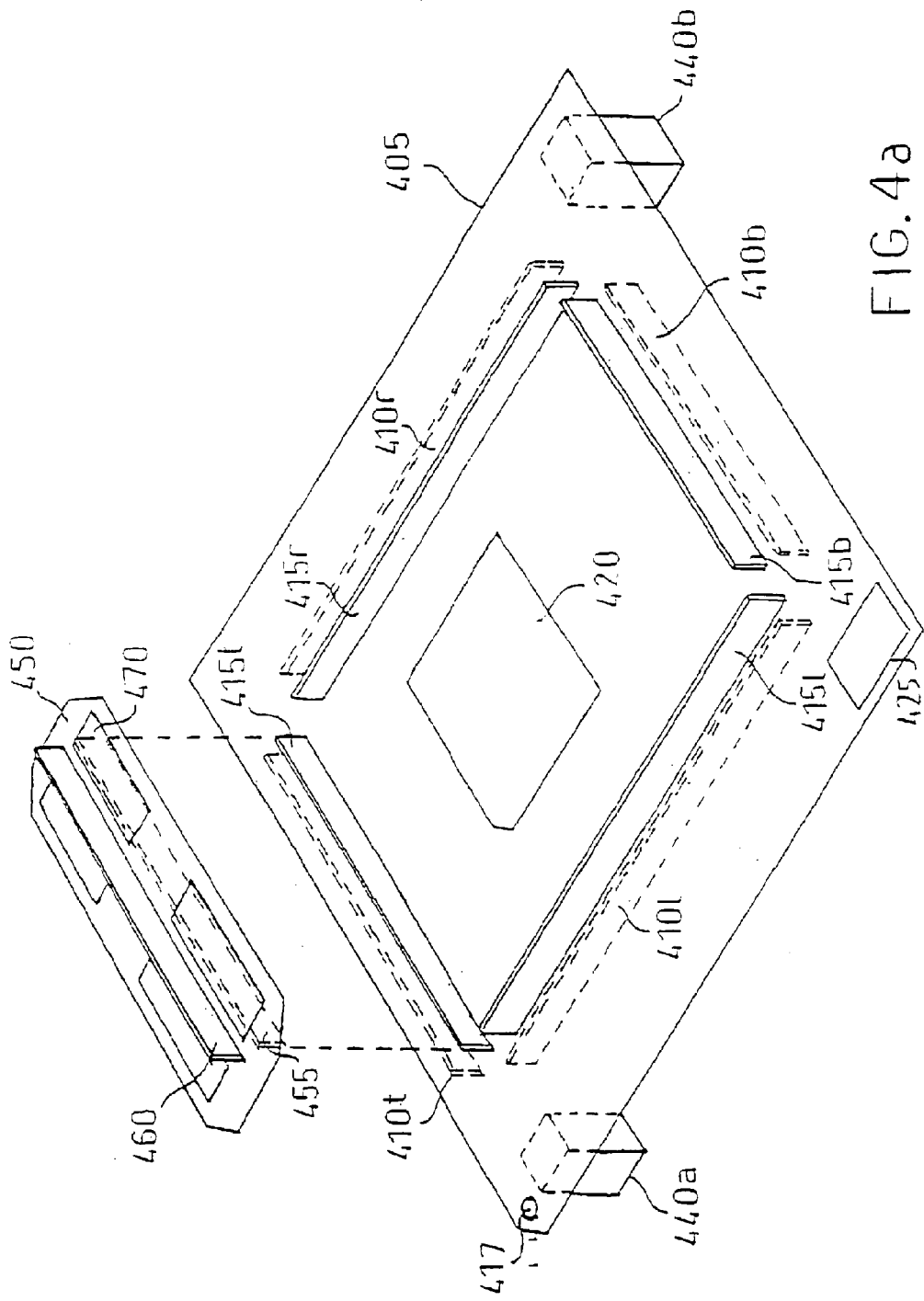
FIG. 4a depicts the daughter board.

Two explanatory examples of daughter boards for FPGA (FIGS. 4a and 4b) and for microprocessor (FIG. 5), respectively, are now described in detail. Considering in particular FIG. 4a, the prototyping system includes one or more daughter boards 405, which are mounted onto the mother board. A connector is arranged on a lower surface of the daughter board 405, and a socket is arranged on an upper surface of the daughter board 405 (inside the connector in plan view).

The connector consists of a top element 410t and a right element 410r moving counter clockwise from a reference key 417 (for the insertion key of a corresponding socket of the mother board), and a left element 410l and a bottom element 410b moving clockwise from the reference key 417 (looking at the daughter board 405 from below). Similarly, the socket consists of a left element 415l and a bottom element 415b moving counter clockwise from the reference key 417, and a top element 415t and a right element 415r moving clockwise from the reference key 417 (looking at the daughter board 405 from above). The elements of the connector (denoted as a whole with 410) and the elements of the socket (denoted as a whole with 415) are arranged along concentric squares.

Each connector element consists of 228 pins and 6 power male elements (matching a corresponding socket element of the mother board), and each socket element consists of 228 holes and 6 power female elements; the pins and the power male elements of the connector 410 are coupled with corresponding holes and power female elements of the socket 415 through conductive tracks and via-holes.

An FPGA 420 and an E$^2$PROM 425 are mounted on the upper surface of the daughter board 405. Particularly, the daughter board 405 is provided with a plurality of conductive pads for surface mounting corresponding terminals of the FPGA 420 and of the memory 425 (for example of the ball grid array type). The memory 425 is used to configure the FPGA 420, to which it is connected through conductive tracks (and via-holes). The FPGA 420 has a reference corner (identified by a chamfer), which faces the insertion key 417.

Two power converters 440a and 440b are mounted on the lower surface of the daughter board 405 (at opposed corners thereof). The converters 440a,b are connected to the power male elements of the connector 410 (for receiving the power supply voltages provided by the back-plane through the mother board); the converter 440a and the converter 440b supplies the FPGA 420 and the memory 425, respectively (for example with a voltage of lower value). The power male elements with the associated converters make it possible to use devices that require a power supply voltage of any value.

The pads of the daughter board 405 (on which the FPGA 420 is mounted) are connected to corresponding pins of the connector 410 and to corresponding holes of the socket 415. In this way, functional terminals of the FPGA 420 (distinct from power supply terminals connected to the converter 440a and configuration terminals connected to the memory 425) are connected to both the connector 410 and the socket 415.

One to four auxiliary boards 450 (only one shown in the figure) are mounted onto the daughter board 405. A connector element 455 and an opposed socket element 460 are arranged on a lower surface and on an upper surface, respectively, of the auxiliary board 450. The connector element 455 consists of 228 pins and 6 power male elements matching a corresponding element of the socket 415, and the socket element 460 consists of 228 holes (without any power element). The pins of the connector element 455 are coupled with corresponding holes of the socket element 460 through via-holes.

The auxiliary board 450 carries local resources (such as memory modules) used by the FPGA 420. Particularly, both the lower surface and the upper surface of the auxiliary board 405 are provided with a plurality of conductive pads for surface mounting corresponding terminals of local memory modules 470 (four on both surfaces in the example shown in the figure). The pads of the auxiliary board 450 are connected to corresponding pins of the connector element 455 and to corresponding holes of the socket element 460; in this way, functional terminals of the local memories 470 (distinct from power supply terminals connected to the power male elements of the connector 455) are connected to corresponding functional terminals of the FPGA 420.

Similar considerations apply if the daughter board has a different structure, if the reference key is replaced by an equivalent mounting element, if the socket has a different number of elements (down to a single element), if the pads are replaced by equivalent contacts, if the daughter board carries an MPGA (or one or more equivalent hardware programmable devices, for which it is possible to configure the internal physical connections), if no power converter is employed, if the auxiliary board has a different structure, if it carries a different number of memory modules (down to a single one) or any other device which is locally used by the FPGA, and so on.

Figure 4B:
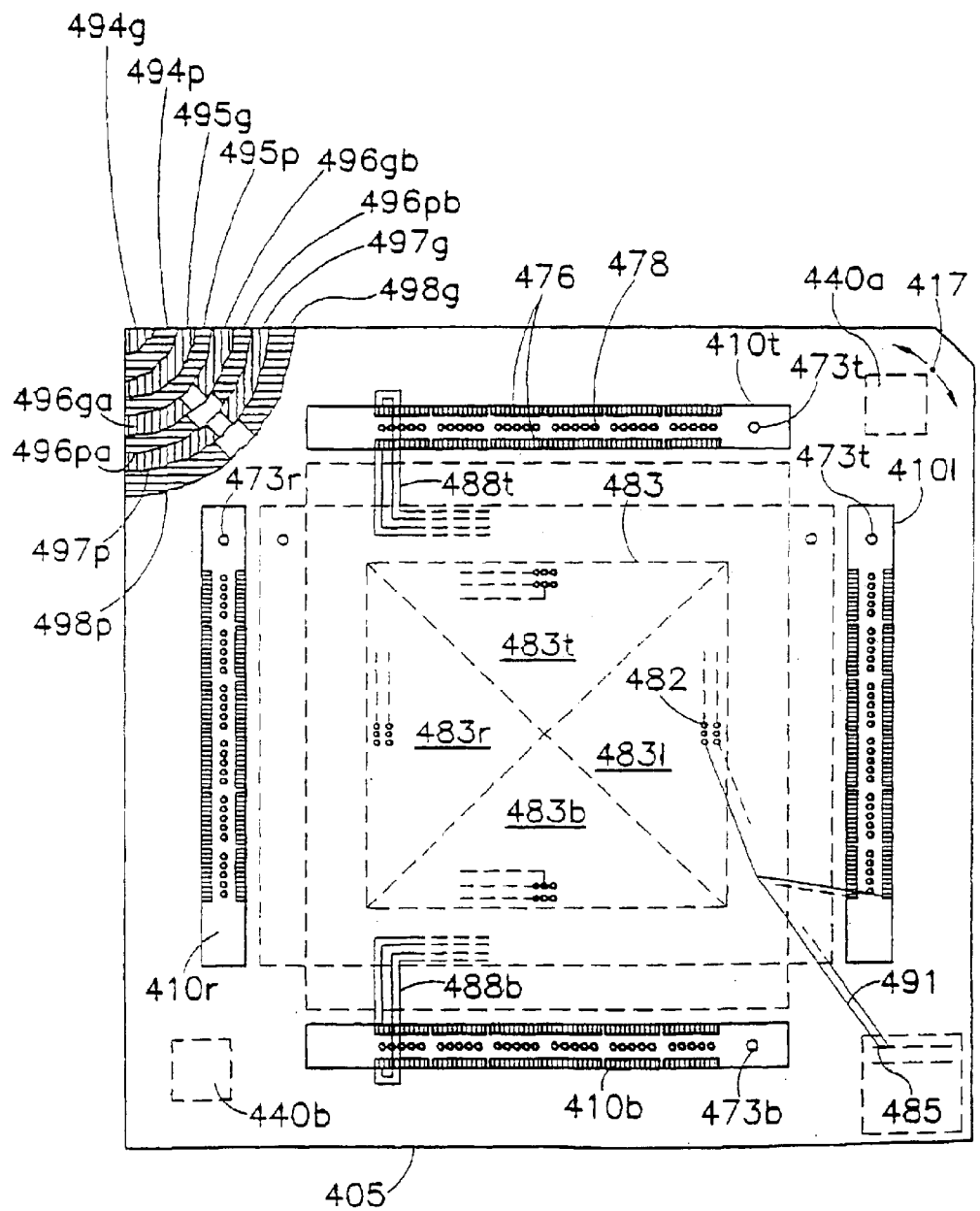
FIG. 4b is a partially cut away view from below of the daughter board.

As shown in FIG. 4b, each connector element 410t, 410r, 410b and 410l consists of an elongated insulating support having a first free end (identified by a reference key 473t, 473r, 473b and 473l, respectively) and a second free end opposed thereto. The first free ends of the connector elements 415t and 415l are close to the reference key 417; the first free ends of the connector elements 410r and 410b are close to the second free ends of the connector elements 410t and 410l, respectively.

Each connector element 410t–410b includes two parallel rows of pins 476 (an internal one and an external one). The pins 476 are numbered from the reference key 473t–473b, alternating a pin of the external row and a pin of the internal row. Therefore, the external row consists of the odd pins from 1 to 227, whereas the internal row consists of the even pins from 2 to 228. The connector element 410t–410b further includes a row of power male elements 478, which is arranged between the two parallel rows of pins 476. Each power male element 478 consists of five leads, or blades. The blades are numbered from the reference key 473t–473b, so that the first, second, third, fourth, fifth and sixth power male elements are formed by the blades 229–233, 234–238, 239–243, 244–248, 249–253 and 254–259, respectively.

A matrix of pads 482 (on the opposed surface of the daughter board 405) is used for mounting the FPGA. The pads 482 are arranged in a square area 483 concentric with the connector 410 in plan view. The square area 483 is split into four sectors by its diagonals; particularly, a top sector 483t is subtended by an edge of the square area facing the connector element 410t (in plan view), a right sector 483r is subtended by an edge facing the connector element 410r, a left sector 483l is subtended by an edge facing the connector element 410l, and a bottom sector 483b is subtended by an edge facing the connector element 410b. A further matrix of pads 485 is used for mounting the E²PROM; the pads 485 are arranged close to the second free end of the connector element 410l and to the first free end of the connector element 410b.

The pads 482 of each sector 483t–483b are connected to corresponding pins 476 of the facing connector elements 410t–410b (in plan view). Most of the pads 482 (for functional terminals of the FPGA) are used to exchange input/output signals with corresponding input/output terminals of the FPGA; the remaining pads 482 are used to exchange control signals with corresponding control terminals of the FPGA. The pads 482 for control terminals of the FPGA are arranged around a centre of each edge of the square area 483. The pads 482 for input/output terminals are connected to the pins 476 of the corresponding connector elements 410t–410b starting from the first free end (from pin 1 to pin 222); the pads 482 for control terminals are connected to the pins 476 of the corresponding connector elements 410t–410b starting from the second free end (from pin 228 back to pin 223).

More specifically, the sector 483t includes four pads 482 for control terminals, each one used for supplying a different clock signal to the FPGA (CLK1, CLK2, CLK3 and CLK4). These pads are connected to the pins from 228 to 225 of the connector element 410t through a conductive track 488t (with the pins 224 and 223 that are reserved for future use); all the conductive tracks 488t have the same length (for example 75 mm).

The sector 483r includes four pads 482 for control terminals. The pad connected to the pin 228 of the connector element 410r is used for providing a signal PLUG_PRESENT to the mother board; the signal PLUG_PRESENT indicates the mounting of the daughter board when asserted (for example at a reference voltage, or ground). The pad connected to the pin 227 is used for a reset signal JTRST of a JTAG (Joint Test Access Group) interface of the FPGA. The pad connected to the pin 226 is used for supplying a system reset signal SYS_RESET to the FPGA. The pad connected to the pin 225 is used for providing a signal FPGA_DONE to the mother board; the signal FPGA_DONE indicates the completion of loading of the configuration data from the E²PROM (started automatically as soon as the FPGA is turned on or forced by means of a signal FPGA_PROGRAM). The pins 224 and 223 are reserved for future use.

The sector 483*l* includes five pads 482 for control terminals. The pads connected to the pins 228, 227, 226 and 225 of the connector element 410*l* are used for an input signal JTDI, an output signal JTDO, a test mode selection signal JTTMS, and a dedicated clock signal JTCLK of the JTAG interface of the FPGA, respectively. The pad connected to the pin 224 is used for providing the signal FPGA_PROGRAM to the daughter board; the signal FPGA_PROGRAM triggers a (warm) re-loading of the configuration data from the E²PROM. The pin 223 is reserved for future use.

In a similar manner, five of the pads 485 are used for connection to a JTAG interface of the E²PROM. The pads 482 and the pads 485 for the JTDI and JTDO signals are connected in series to form a JTAG chain. The signals JTRST, JTTMS and JTCLK are supplied to both the FPGA and the E²PROM; particularly, the pin 226 (signal JTTMS) and the pin 225 (signal JTCLK) of the connector element 410*l* are coupled with the respective pads 482 and 485 through a conductive track 491 having a balanced tree structure.

ground plane is likewise split into two portions 496*ga* and 496*gb*. The portion 496*pa* provides a power supply voltage of +12V and the portion 496*pb* provides a power supply voltage of −12V relative to the portion 496*ga* and to the portion 496*gb*, respectively, of the ground plane. The first and the second power male elements of the connector elements 410*t* and 410*l* are coupled with the portion 496*pa* (+12V) and to the portion 496*ga*, respectively; the first and the second power male elements of the connector elements 410*r* and 410*b* are coupled with the portion 496*pb* (−12V) and with the portion 496*gb*, respectively.

Moreover, a still further plane is split into a power supply portion 497*p* and a ground portion 497*g*, which are coupled to the converter 440*a*; the portion 497*p* provides a power supply voltage of +1.8V relative to the portion 497*g*. In a similar manner, another plane is split into a power supply portion 498*p* and a ground portion 498*g*, which are coupled to the converter 440*b*; the portion 498*p* provides a power supply voltage of +2.5V relative to the portion 498*g*.

In brief, the pin-out of the connector 410 is defined by the following tables:

|  | 1 ... 222 | 223 | 224 | 225 | 226 | 227 | 228 |
|---|---|---|---|---|---|---|---|
| 410t | I/O | Reserved | Reserved | CLK4 | CLK3 | CLK2 | CLK1 |
| 410r | I/O | Reserved | Reserved | FPGA_DONE | SYS_RESET | JTRST | PLUG_PRESENT |
| 410l | I/O | Reserved | FPGA_PROGRAM | JTTMS | JTCLK | JTDO | JTDI |
| 410b | I/O | Reserved | Reserved | CLK8 | CLK7 | CLK6 | CLK5 |

| Element/pin | 229 ... 233, | 234 ... 238 | 239 ... 243 | 244 ... 248 | 249 ... 253 | 254 ... 258 |
|---|---|---|---|---|---|---|
| 410t | +12 V | 0 (−12 V) | +5 V | 0 (+5) | +3.3 | 0 (+3.3) |
| 410r | −12 V | 0 (+12 V) | +5 V | 0 (+5) | +3.3 | 0 (+3.3) |
| 410l | +12 V | 0 (−12 V) | +5 V | 0 (+5) | +3.3 | 0 (+3.3) |
| 410b | −12 V | 0 (+12 V) | +5 V | 0 (+5) | +3.3 | 0 (+3.3) |

The sector 483*b* includes four pads 482 for control terminals, each one used for supplying a different clock signal to the FPGA (CLK5, CLK6, CLK7 and CLK8). These pads are connected to the pins from 228 to 225 of the connector element 410*b* through conductive tracks 488*b* of the same length (with the pins 224 and 223 that are reserved for future use).

As shown in the partially cut away view of the figure, the daughter board 405 has a multi-layer structure. A power supply plane 494*p* provides a power supply voltage of +3.3V with respect to a corresponding ground plane 494*g*. The fifth and the sixth power male elements of each connector element 410*t*–410*b* are coupled to the power supply plane 494*p* and to the ground plane 494*g*, respectively. In a similar manner, a power supply plane 495*p* provides a power supply voltage of +5V with respect to a corresponding ground plane 495*g*. The third and the fourth power male elements of each connector element 410*t*–410*b* are coupled to the power supply plane 495*p* and to the ground plane 495*g*, respectively.

A further power supply plane is split into two portions 496*pa* and 496*pb* along a diagonal of the daughter board 405 (not running across the reference key 417); a corresponding Similar considerations apply if the connector has a different structure, if each connector element is of the female type or includes a different number of leads, if each power male element consists of a different number of blades (down to a single one), if the E²PROM is placed elsewhere, if the daughter board has a different number of power supply planes, if different power supply voltages are used, if two or more power supply planes are split into portions providing opposed voltages, and the like.

Figure 5:
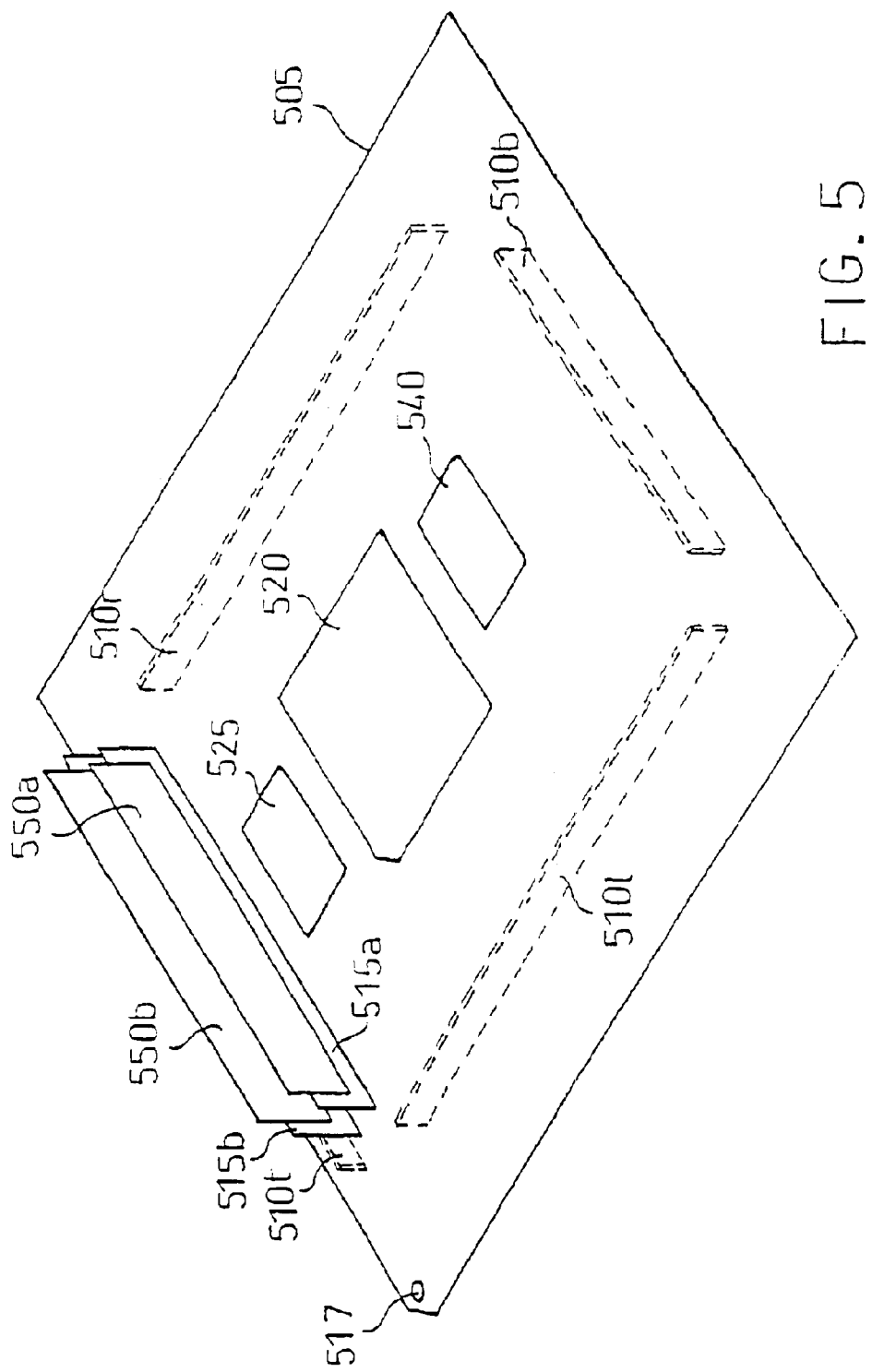
FIG. 5 shows a different daughter board of the prototyping system.

A different type of daughter board 505 to be mounted onto the mother board is depicted in FIG. 5. A connector similar to the one described above is arranged on a lower surface of the daughter board 505. The connector is square-shaped and has a top element 510*t* and a right element 510*r* moving counter clockwise from a reference key 517 (for the insertion key of a corresponding socket of the mother board), and a left element 510*l* and a bottom element 510*b* moving clockwise from the reference key 517. A socket consisting of two parallel elements 515*a* and 515*b* is arranged on an upper surface of the daughter board 505. Each connector element consists of 228 pins and 6 power male elements (matching a corresponding socket of the mother board), and each socket element consists of 228 holes and 6 power female elements. The power male elements of the connector 510 are coupled with the corresponding power female elements of the socket 515 (through conductive tracks and via-holes).

A microprocessor 520, an E²PROM 525 and a SRAM 540 are mounted on the upper surface of the daughter board 505, inside the connector 510 in plan view. Particularly, the daughter board 505 is provided with a plurality of conductive pads for surface mounting corresponding terminals of the microprocessor 520, the E²PROM 525 and the SRAM 540. The memory 525 stores a program controlling the microprocessor 520, and the memory 540 is used by the microprocessor 520 as a working memory. The microprocessor 520 has a reference corner (identified by a chamfer), which faces the reference key 517.

Memory modules 550a and 550b (such as of the DIMM type) are plugged into the respective socket elements 515a and 515b; each memory module 550a, 550b consists of a board that carries several DRAMs and is provided with an edge connector (matching the socket element 515a, 515b).

Some pads of the daughter board 505 (on which the microprocessor 520 is mounted) are connected to corresponding pins of the connector 510, whereas some other pads are connected to corresponding holes of the socket 515. In this way, a first sub-set of functional terminals of the microprocessor 520 is coupled with the memory modules 550a, 550b and a second sub-set of functional terminals of the microprocessor 520 is coupled with the connector 510.

The daughter board described above allows standard devices to be readily inserted into the prototyping system. Similar considerations apply if the daughter board has a different structure, if the socket has a different number of elements or if the daughter board has no socket, if the microprocessor is replaced by an I/O device (or one or more equivalent not-hardware programmable devices), if the memory modules are of a different type (such as SIMMs), and the like.

Figure 6:
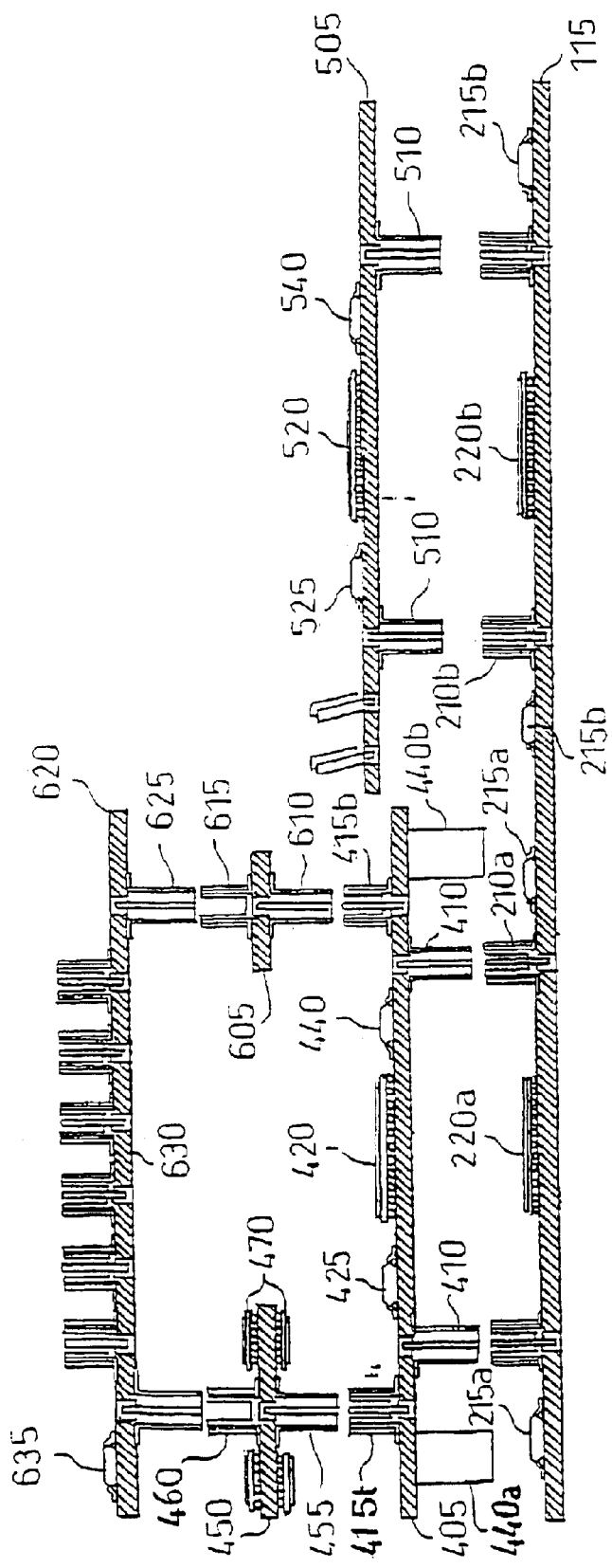
FIG. 6 is a cross-section view of the mother board with two daughter boards and one debugging board.

With reference now to FIG. 6, the daughter boards 405 and 505 are mounted onto the mother board 115; the connector 410 is plugged into the socket 210a and the connector 510 is plugged into the socket 210b. The auxiliary board 450 is mounted onto the daughter board 405. Particularly, the connector element 455 is plugged into the socket element 415t; no auxiliary board is plugged into the other socket elements (such as the socket element 415b shown in the figure).

In this case, an extender board 605 is employed; the extender board has a connector element 610 (arranged on a lower surface thereof) and an opposed socket element 615 (arranged on an upper surface thereof). The connector element 610 consists of 228 pins (without any power element) and the socket element 615 consists of 228 holes (without any power element). The pins of the connector element 610 are coupled with the corresponding holes of the socket element 615 through via-holes.

The system further includes a debugging board 620, which is mounted on top of the above described stack. Multiple connectors 625 are arranged on a lower, surface of the debugging board 620, and multiple sockets 630 are arranged on an upper surface thereof. Each connector 625 is square-shaped, with four elements (each one consisting of 228 pins) matching corresponding socket elements 455 or 610. Each socket 630 includes several holes for plugging in corresponding probe terminals connected to the host computer (not shown in the figure). The connectors 625 and the sockets 630 are coupled (though conductive tracks and via-holes) with a switch matrix 635 (mounted on the upper surface of the debugging board 620); the switch matrix 635 selectively connects each pin of the connectors 625 to a corresponding hole of the sockets 630.

The particular structure of the auxiliary boards facilitates the use of the debugging board. Moreover, the extender boards allow the debugging board to be readily connected to the system even when one or more socket elements of the daughter board are free.

Each time the design of an electronic circuit under validation has been scattered across several FPGAs, these FPGAs are mounted onto corresponding daughter boards. The local resources for each FPGA (i.e., the memory modules) are mounted onto auxiliary boards, which are plugged into the daughter board carrying the FPGA. The other devices (such as microprocessors and I/O units) defining a real world target system in which the electronic circuit must operate are mounted onto different daughter boards. All the daughter boards (carrying the FPGAs or the other devices) are plugged into corresponding sockets of the mother boards. The mother boards are then mounted onto the back-plane (together with the other system boards).

The system is connected to the host computer controlling the prototyping process. Particularly, configuration data for the FPGAs and the programs controlling the microprocessors are downloaded into the corresponding memories. In a similar manner, the memories associated with each socket of the mother boards are loaded with configuration data for the respective switches, in order to define the required connectivity of the system.

More specifically, when an auxiliary board is plugged into a socket element of the daughter board, the corresponding switches on the mother board are both open, so that the holes of the socket on the mother board, and then also the terminals of the FPGA, are only connected to the terminals of the local resources mounted onto the auxiliary board (being insulated from the connections of the mother board). Conversely, when a socket element of the daughter board is free, one or more of the corresponding switches on the mother board are closed, so that the holes of the socket on the mother board, and then also the terminals of the FPGA, are coupled with the selected connections on the mother board; as a consequence, the FPGA is connected to another FPGA or to a different device either on the same mother board (through a point-to-point connection) or on a different mother board (through a bus of the back-plane, a cross-bar board of the back-plane, or a flexible printed circuit).

Similar considerations apply if the extender board and the debugging board have a different structure, if the socket of the debugging board has a different number of holes (for the probe terminals), if the holes of the socket and the pins of the connector on the debugging board are connected in a different manner, and the like. Alternatively, the auxiliary boards have a different structure (for example of the SIMM or DIMM type), a different connection of the debugging board is envisaged (even without any extender board), probing-plugs are directly provided on the mother board and daughter boards, and the like.

More generally, the present invention provides a daughter board for a prototyping system. The daughter board has a first surface for facing a mother board of the prototyping system and a second surface opposed thereto. A connector for a corresponding socket of the mother board is arranged on the first surface; the connector consists of a plurality of elements, each one including an insulating support and a plurality of leads. Multiple contacts for corresponding functional terminals of a programmable device are arranged on the second surface; each contact is connected to a corresponding lead of the connector. The elements of the connector are arranged along the edges of a regular polygon.

The structure of the daughter board according to the present invention has been found to be specifically suitable for use in a prototyping system.

Particularly, the devised arrangement of the connector elements makes it possible to optimise the signal transmission both on the daughter board and on the corresponding mother board. This results in a substantial isotropic and very low (for example of a few ns) transmission delay in the whole prototyping system. As a consequence, the prototyping system runs at the same speed as the actual electronic circuit (for example in the order of 100 MHz), so that the prototype can be operated and tested under normal working conditions.

The preferred embodiment of the invention described above offers further advantages.

Particularly, the daughter board includes a further socket for local resources that are used by the FPGA; each pad for the FPGA is connected to both the connector and the socket of the daughter board. This solution makes it possible to place the local resources directly where they are used (by the FPGAs).

However, the solution according to the present invention leads itself to be used even in a different daughter board, such as the one described above for the microprocessors and the I/O units.

Preferably, the connector is square-shaped, with two connector elements that are arranged clockwise and the other two connector elements that are arranged counter clockwise (from the reference key). This arrangement of the connector elements has been found to be the preferred topology of the daughter board; moreover, the corresponding sockets on the mother board (arranged at the corners of a rectangle, with the insertion keys inward-looking the rectangle) optimise the routing of the signals, thereby reducing the number of layers required in the mother board.

Alternatively, the connector elements are arranged along a different regular polygon (such as a triangle, a pentagon, and so on), the daughter board is used with a mother board having a different number of sockets (down to a single socket) or with the sockets turned differently.

The pads of the daughter board used by the FPGA are grouped in several sectors; the pads of each sector are connected to the pins of the corresponding connector element. Therefore, each pad is directly connected to the respective pin with an optimised path; this structure improves the performance of the daughter board (and then of the whole prototyping system).

The pads for input/output terminals of the FPGA are connected to a sub-set of the pins starting from the free end of the corresponding connector element identified by the reference key; the pads for control terminals are connected to a further sub-set of the pins starting from the other free end of the connector element opposed to the reference key. The arrangement of consecutive pins in two subsets (starting from opposed free ends of the connector element) is particularly advantageous for programming and debugging purposes; moreover, the proposed feature is very flexible and allows the daughter board to be readily adapted to FPGAs having a higher number of terminals.

The pads for clock terminals of the FPGA are arranged around the centre of the edge of the top and bottom sectors, and they are connected to the pins of the corresponding connector element starting from the free end opposed to the reference key; the connection is made with conductive tracks having the same length. This structure does not provide the shortest path for the clock signals on the daughter board (as it would be if the pads for the clock signals were connected to the central pins of the corresponding connector element); however, the inventors have discovered that the proposed arrangement surprisingly yields to higher performance of the whole prototyping system, due to the improved routing of the clock signals on the mother board.

The pin of the left connector element transmitting the JTCLK signal is connected to the corresponding pads for the FPGA and for the $E^2PROM$ through a conductive track having a balanced tree structure. This ensures an optimal distribution of this signal to both the FPGA and the $E^2PROM$.

Alternatively, the pads are arranged in an area with a different shape (and then with a different number of sectors), the pads for input/output terminals and for control terminals are in a different number, a different number of clock signals are used, the JTAG interface is replaced by an equivalent serial test interface, and the like. However, the solution of the invention leads itself to be implemented even with the pads connected to the corresponding pins in a different manner, with different control terminals of the FPGA, with a single clock signal or even without any JTAG interface.

Each power supply plane is connected to corresponding blades of each connector element. In this way, the power supply plane is contacted in multiple points, so as to ensure a uniform distribution of the respective power supply voltage to the FPGA.

The sectioning of the power supply plane providing the opposed power supply voltages of +12V and −12V yields to a structure that is very flexible and compact at the same time.

Alternatively, the power supply is distributed to the daughter board in a different way, the power supply planes are split in a different manner, or every power supply plane provides a single power supply voltage.

The prototyping system using the daughter boards of the present invention substantially reduces the time required for setting up a new prototype (when compared with the one required by a breadboard). Moreover, the system can be re-used for different prototypes, so that the investment required can be recovered in a short time.

The envisaged solution is very flexible, since the connectivity scheme can be readily altered. This result is obtained with a structure on which not any prototype can be fitted, since a complete interconnectivity is not provided. However, the inventors have devised a structure that accommodates the most ordinary characteristics that have been identified among several design categories, so that most of the electronic circuits can be tested with the proposed prototyping system.

However, the daughter board of the invention leads itself to be used even in a different prototyping system, for example with the switches placed on each daughter board (for selectively connecting the terminals of the FPGA either to the socket or to the connector and then to a point-to-point connection on the mother board, hardwired coupled thereto).

Naturally, in order to satisfy local and specific requirements, a person skilled in the art may apply to the solution described above many modifications and alterations, all of which, however, are included within the scope of protection of the invention as defined by the following claims.

What is claimed is:

1. A daughter board for a prototyping system, said daughter board comprising:
   a first surface for facing a mother board of the prototyping system and a second surface opposed thereto;
   a connector for a corresponding socket of the mother board, the connector being arranged on the first surface of the daughter board and including a plurality of elements, each of the elements including an insulating support and a plurality of leads; and
   a plurality of contacts for corresponding functional terminals of a programmable device, the contacts being arranged on the second surface of the daughter board, each of the contacts being connected to a corresponding lead of the connector,
   wherein the elements of the connector are arranged along the edges of a regular polygon,
   each element of the connector includes a first and a second sub-set of leads connected to corresponding contacts for input/output terminals and control terminals of the programmable device, the contacts for control terminals of each sector being arranged around a center of a corresponding edge of a regular polygonal area, and
   the first sub-set and the second sub-set are arranged starting from a first free end and from a second free end, respectively, of each element of the connector.

2. The daughter board according to claim 1, further including a further socket arranged on the second surface for connecting local resources associated with the programmable device, each contact being further connected to a corresponding lead of the further socket.

3. The daughter board according to claim 1,
   wherein the regular polygon is a square,
   the elements of the connector include a first and a second element arranged counter clockwise on the first surface from a mounting reference of the daughter board, and a third and a fourth element arranged clockwise on the first surface from the mounting reference, and
   each element of the connector has a first and a second free end moving along the corresponding direction from the mounting reference.

4. The daughter board according to claim 1,
   wherein the contacts are arranged in a regular polygonal area concentric with the regular polygon in plan view, the regular polygonal area including a plurality of sectors each one facing a corresponding element of the connector in plan view, and
   the contacts of each sector are connected to the leads of the corresponding element of the connector.

5. The daughter board according to claim 3, wherein the contacts for control terminals of the sector corresponding to the first and the fourth element of the connector are for clock terminals of the programmable device, the contacts for clock terminals being connected to the corresponding leads through conductive tracks having the same length.

6. The daughter board according to claim 3, wherein the contacts for control terminals of the sector corresponding to the third element include a contact for a test clock terminal of the programmable device, the corresponding lead being connected to the contact for the test clock terminal and to a further contact for a test clock terminal of a configuration memory of the programmable device through a further conductive track having a balanced tree structure.

7. The daughter board according to any claim 1, further including a plurality of power supply planes each one for providing a corresponding power supply voltage, each power supply plane being connected to at least one corresponding lead of each element of the connector.

8. A daughter board for a prototyping system, said daughter board comprising:
   a first surface for facing a mother board of the prototyping system and a second surface opposed thereto;
   a connector for a corresponding socket of the mother board, the connector being arranged on the first surface of the daughter board and including a plurality of elements, each of the elements including an insulating support and a plurality of leads; and
   a plurality of contacts for corresponding functional terminals of a programmable device, the contacts being arranged on the second surface of the daughter board, each of the contacts being connected to a corresponding lead of the connector,
   wherein the elements of the connectors are arranged along the edges of regular polygon, and
   the daughter board further comprises:
      a plurality of power supply planes each one for providing a corresponding power supply voltage, each power supply plane being connected to at least one corresponding lead of each element of the connector; and
      at least one further power supply plane split into a first and a second portion for providing a first power supply voltage and a second power supply voltage opposed to the first power supply voltage, the first portion of the further power supply plane being connected to at least one corresponding lead of the first and third element of the connector, and the second portion of the further power supply plane being connected to at least one corresponding lead of the second and fourth element of the connector.

9. A prototyping system comprising:
   at least one mother board having a plurality of sockets;
   a plurality of point-to-point connections for pairs of the sockets; and
   at least one daughter board comprising:
      a first surface for facing the mother board of the prototyping system and a second surface opposed thereto;
      a connector for a corresponding socket of the mother board, the connector being arranged on the first surface of the daughter board and including a plurality of elements, each of the elements including an insulating support and a plurality of leads;
      a plurality of contacts for corresponding functional terminals of a programmable device, the contacts being arranged on the second surface of the daughter board, each of the contacts being connected to a corresponding lead of the connector; and
      a further socket arranged on the second surface of the daughter board for connecting local resources associated with the programmable device, each contact being further connected to a corresponding lead of the further socket,
      wherein the elements of the connector are arranged along the edges of a regular polygon,
   wherein the connector of each daughter board is plugged into a corresponding socket, and
   a plurality of electronic switches are arranged on the mother board for selectively connecting each lead of the socket to a corresponding lead of the point-to-point connections.

10. The prototyping system according to claim 9, wherein the regular polygon of the daughter board is a square, the elements of the connector of the daughter board include a first and a second element arranged counter clockwise on the first surface from a mounting reference of the daughter board, and a third and a fourth element arranged clockwise on the first surface from the mounting reference, and each element of the connector of the daughter board has a first and a second free end moving along the corresponding direction from the mounting reference.

11. The prototyping system according to claim 10, wherein the contacts for control terminals of the sector corresponding to the first and the fourth element of the connector of the daughter board are for clock terminals of the programmable device, the contacts for clock terminals being connected to the corresponding leads through conductive tracks having the same length.

12. The prototyping system according to claim 10, wherein the contacts for control terminals of the sector corresponding to the third element of the daughter board include a contact for a test clock terminal of the programmable device, the corresponding lead being connected to the contact for the test clock terminal and to a further contact for a test clock terminal of a configuration memory of the programmable device through a further conductive track having a balanced tree structure.

13. The prototyping system according to claim 9, wherein the contacts of the daughter board are arranged in a regular polygonal area concentric with the regular polygon in plan view, the regular polygonal area including a plurality of sectors each one facing a corresponding element of the connector in plan view, and the contacts of each sector of the daughter board are connected to the leads of the corresponding element of the connector.

14. The prototyping system according to claim 9, wherein each element of the connector of the daughter board includes a first and a second sub-set of leads connected to corresponding contacts for input/output terminals and control terminals of the programmable device, the contacts for control terminals of each sector being arranged around a center of a corresponding edge of a regular polygonal area, and the first sub-set and the second sub-set are arranged starting from a first free end and from a second free end, respectively, of each element of the connector.

15. The prototyping system according to claim 9, wherein the daughter board further includes a plurality of power supply planes each one for providing a corresponding power supply voltage, each power supply plane being connected to at least one corresponding lead of each element of the connector.

16. The prototyping system according to claim 15, the daughter board further includes at least one further power supply plane split into a first and a second portion for providing a first power supply voltage and a second power supply voltage opposed to the first power supply voltage, the first portion of the further power supply plane being connected to at least one corresponding lead of the first and third element of the connector, and the second portion of the further power supply plane being connected to at least one corresponding lead of the second and fourth element of the connector.

\* \* \* \* \*